United States Patent
Camacho et al.

(10) Patent No.: US 8,786,063 B2
(45) Date of Patent: Jul. 22, 2014

(54) INTEGRATED CIRCUIT PACKAGING SYSTEM WITH LEADS AND TRANSPOSER AND METHOD OF MANUFACTURE THEREOF

(75) Inventors: Zigmund Ramirez Camacho, Singapore (SG); Henry Descalzo Bathan, Singapore (SG); Arnel Senosa Trasporto, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 310 days.

(21) Appl. No.: 12/467,146

(22) Filed: May 15, 2009

(65) Prior Publication Data

US 2010/0289128 A1 Nov. 18, 2010

(51) Int. Cl.
- H01L 23/12 (2006.01)
- H01L 23/053 (2006.01)
- H01L 23/02 (2006.01)
- H01L 23/48 (2006.01)
- H01L 23/28 (2006.01)

(52) U.S. Cl.
USPC .......... 257/670; 257/678; 257/701; 257/784; 257/787; 257/E23.141

(58) Field of Classification Search
USPC ......... 257/670, 676, 784, 668, 701, 753, 678, 257/787, E23.141, E21.705; 361/760, 772
See application file for complete search history.

(56) References Cited

U.S. PATENT DOCUMENTS

| | | | | |
|---|---|---|---|---|
| 5,378,657 A * | 1/1995 | Lin | | 29/827 |
| 5,497,032 A * | 3/1996 | Tsuji et al. | | 257/710 |
| 5,569,955 A * | 10/1996 | Chillara et al. | | 257/666 |
| 5,705,851 A * | 1/1998 | Mostafazadeh et al. | | 257/675 |
| 5,800,958 A * | 9/1998 | Manteghi | | 438/123 |
| 5,854,512 A * | 12/1998 | Manteghi | | 257/735 |
| 6,020,219 A * | 2/2000 | Dudderar et al. | | 438/118 |
| 6,228,683 B1 * | 5/2001 | Manteghi | | 438/112 |
| 6,271,586 B1 * | 8/2001 | Shen | | 257/723 |
| 6,400,004 B1 | 6/2002 | Fan et al. | | |
| 6,635,957 B2 | 10/2003 | Kwan et al. | | |
| 6,667,546 B2 | 12/2003 | Huang et al. | | |
| 6,724,071 B2 * | 4/2004 | Combs | | 257/666 |
| 6,759,753 B2 * | 7/2004 | Chao | | 257/787 |
| 6,774,479 B2 * | 8/2004 | Schatzler et al. | | 257/695 |
| 6,791,166 B1 | 9/2004 | Foster | | |
| 6,818,973 B1 | 11/2004 | Foster | | |
| 6,879,034 B1 * | 4/2005 | Yang et al. | | 257/700 |
| 6,919,631 B1 * | 7/2005 | Hoffman et al. | | 257/707 |
| 7,122,406 B1 * | 10/2006 | Yilmaz et al. | | 438/123 |
| 7,211,471 B1 | 5/2007 | Foster | | |
| 7,241,645 B2 * | 7/2007 | Zhao et al. | | 438/122 |

(Continued)

FOREIGN PATENT DOCUMENTS

JP    03220759 A *  9/1991 ............. H01L 23/50

OTHER PUBLICATIONS

U.S. Appl. No. 12/484,245, Jun. 14, 2009, Camacho et al.

*Primary Examiner* — Teresa M Arroyo
(74) *Attorney, Agent, or Firm* — Ishimaru & Associates LLP

(57) ABSTRACT

A method of manufacture of an integrated circuit packaging system includes: conductively bonding a first surface of a transposer to an inner end of a lead separate from the transposer; conductively bonding a die to the first surface of the transposer; and encapsulating the inner end with a mold compound having a bottom mold surface that is exposed and is coplanar with a surface of the transposer opposite the first surface.

10 Claims, 6 Drawing Sheets

(56) References Cited

U.S. PATENT DOCUMENTS

| | | | |
|---|---|---|---|
| 7,245,007 B1* | 7/2007 | Foster | 257/678 |
| 7,259,448 B2* | 8/2007 | Zhang et al. | 257/678 |
| 7,279,780 B2 | 10/2007 | Fee et al. | |
| 7,291,908 B2 | 11/2007 | Pan et al. | |
| 7,351,612 B2 | 4/2008 | Gai | |
| 7,402,459 B2 | 7/2008 | Xiaochun et al. | |
| 7,405,467 B2* | 7/2008 | Liu et al. | 257/672 |
| 2002/0074627 A1* | 6/2002 | Combs | 257/666 |
| 2003/0038382 A1* | 2/2003 | Combs | 257/796 |
| 2005/0121767 A1* | 6/2005 | Celaya et al. | 257/692 |
| 2006/0186528 A1* | 8/2006 | Sasaki et al. | 257/690 |
| 2006/0197198 A1* | 9/2006 | Chow et al. | 257/672 |
| 2006/0249823 A1* | 11/2006 | Kim | 257/676 |
| 2007/0114642 A1* | 5/2007 | Hosoyamada et al. | 257/676 |
| 2007/0254409 A1* | 11/2007 | Yip et al. | 438/126 |
| 2007/0284715 A1* | 12/2007 | Li et al. | 257/686 |
| 2007/0296069 A1* | 12/2007 | Terui et al. | 257/676 |
| 2008/0142937 A1* | 6/2008 | Chen et al. | 257/675 |
| 2009/0039488 A1* | 2/2009 | Chan et al. | 257/676 |
| 2009/0085181 A1 | 4/2009 | Advincula, Jr. et al. | |
| 2009/0108422 A1* | 4/2009 | Sasaki et al. | 257/670 |

* cited by examiner

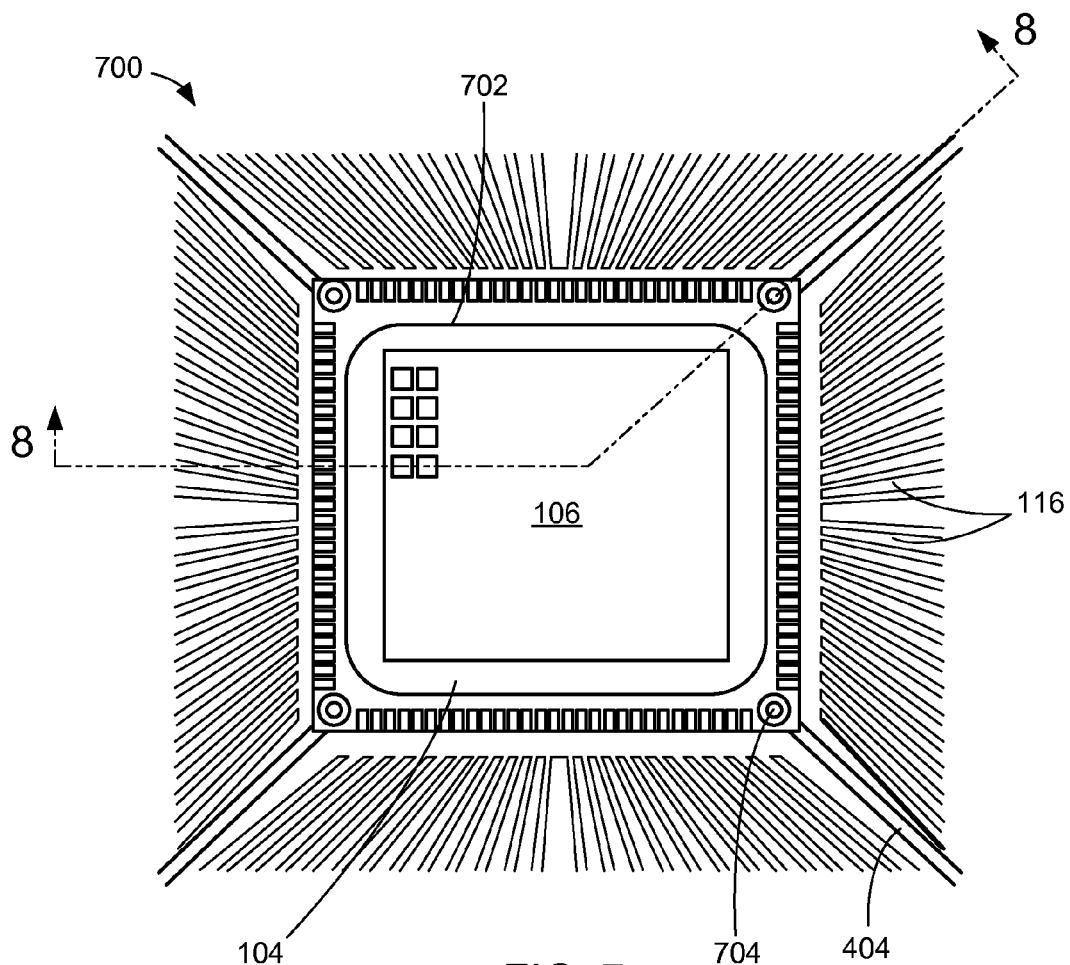
FIG. 7
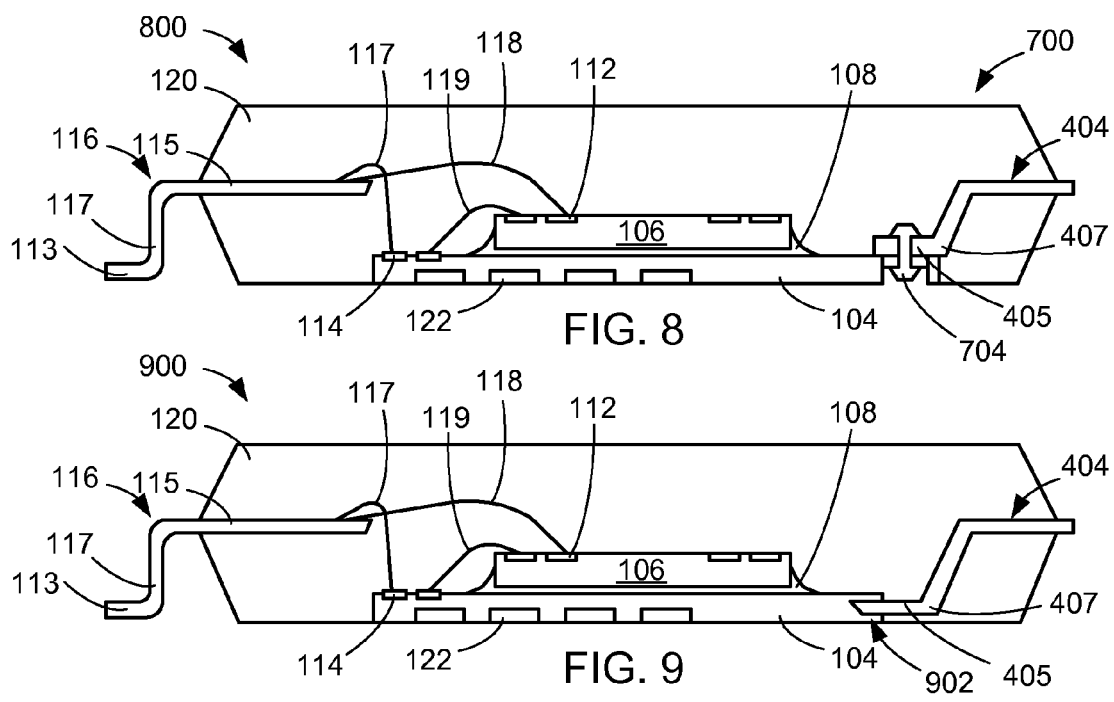
FIG. 8
FIG. 9

INTEGRATED CIRCUIT PACKAGING SYSTEM WITH LEADS AND TRANSPOSER AND METHOD OF MANUFACTURE THEREOF

TECHNICAL FIELD

The present invention relates generally to an integrated circuit packaging system and more particularly to an integrated circuit packaging system with a Quad Flat Package having a transposer.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which these integrated semiconductor chips are mounted include a substrate or other chip-mounting device. One example of such a substrate is a leadframe. Leadframes typically include an area on which an integrated circuit chip is mounted and multiple power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art. The power, ground and/or signal sites on the chip may then be electrically connected to individual leads of the leadframe through techniques such as wire bonding.

An interposer is an electrical interface routing between one socket or connection to another. It is an intermediate layer often used for interconnection routing or as a ground/power plane. When multiple chips are mounted within the same integrated circuit packaging, routing problems may arise due to the different routing design of each individual chip. To solve this problem, an interposer is often used. Sometimes the terms "substrate" and "interposer" are used to refer to the same thing.

Conventional leadframes include a die pad, surrounded by a number of leads. Conventional leadframes typically only have one row of leads and this configuration limits its level of integration. An integrated circuit chip is attached to the die pad using a conductive adhesive such as silver epoxy. The conductive adhesive is cured after die attach. After the die is attached to the die pad, a wire bonding process is typically used to make electrical interconnections between the integrated circuit and the leads of the leadframe. After wire bonding, the leadframe with the integrated circuit attached is encapsulated using a mold compound. Finally, post mold curing and singulation steps are conducted to complete the packaging process.

The leadframe and attached chip(s) may then be mounted on, for example, a circuit board, or card along with other leadframes or devices. The circuit board or card may then be incorporated into a wide variety of devices such as computers, automobiles, and appliances, among others.

A Quad Flat Package (QFP) is a typical integrated circuit packaging configuration where leads extend from each of the four sides of the package. A QFP often uses a leadframe that has leads or pins extending from each of the four sides of the leadframe.

However, conventional QFP system also suffers from a low lead or pin count that negatively impacts the packaging density of the QFP. The modern trend of an integrated circuit packaging system is that multiple chips are integrated within one package and each semiconductor chip has its own individual set of functionalities. This trend of multi-chip integration demands more pin count and higher integration sophistication of the QFP system. Furthermore, conventional QFP also suffers from inadequate signal board routing that also impact its packing density.

Thus, a need still remains for increasing the pin count and improving signal board routing and thus enhancing the packaging density of the QFP system to accommodate the modern trend of integrated circuit packaging. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: conductively bonding a first surface of a transposer to an inner end of a lead separate from the transposer; conductively bonding a die to the first surface of the transposer; and encapsulating the inner end with a mold compound having a bottom mold surface that is exposed and is coplanar with a surface of the transposer opposite the first surface.

The present invention provides an integrated circuit packaging system including: a transposer; a lead having an inner end conductively bonded to a first surface of the transposer; a die conductively bonded to the first surface of the transposer; and a mold compound encapsulating the inner end, the mold compound having a bottom mold surface that is exposed and is coplanar with a surface of the transposer opposite the first surface.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 7 is a top view of a Quad Flat Package of a fifth embodiment of the present invention after a stage of singulation.

FIG. 8 is a cross-sectional view of the Quad Flat Package of the fifth embodiment of the present invention along line 8-8 of FIG. 7 after a stage of singulation.

FIG. 9 is a cross-sectional view of a Quad Flat Package of a sixth embodiment of the present invention after a stage of singulation.

BEST MODE FOR CARRYING OUT THE INVENTION

Figure 1:
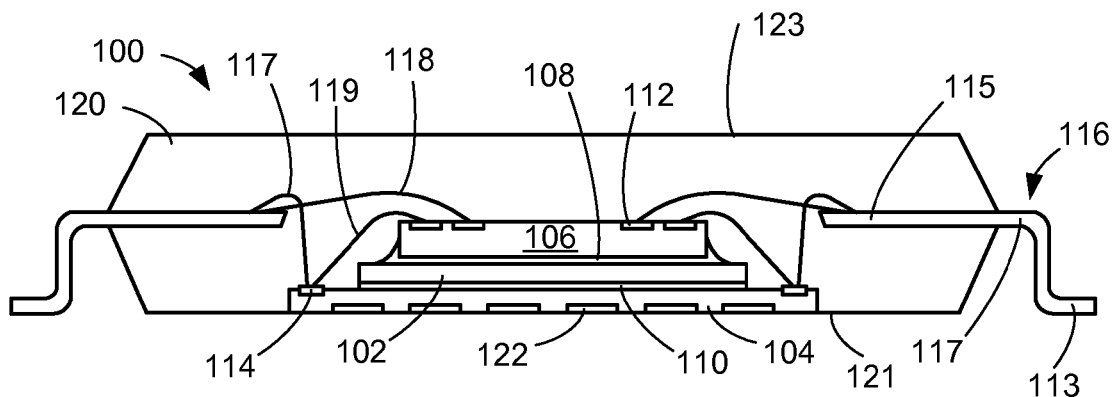
FIG. 1 is a cross-sectional view of a Quad Flat Package of a first embodiment of the present invention along line 1-1 of FIG. 2 after a stage of singulation.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "coplanar" is defined as being in the same plane or flat. With regard to an unfinished leadframe the term means that the unfinished leadframe is in one plane and flat as contrasted with having different heights.

Figure 2:
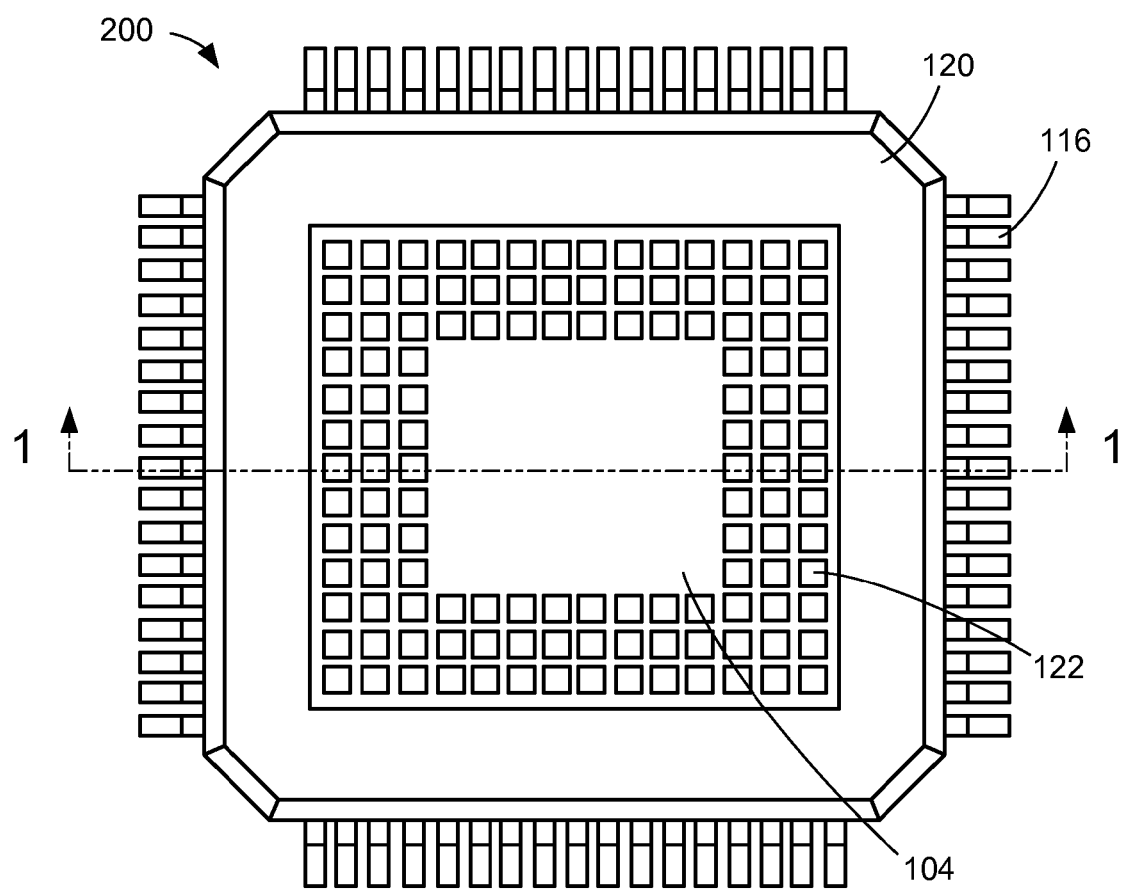
FIG. 2 is a bottom view of the Quad Flat Package of the first embodiment of the present invention after a stage of singulation.

Referring now to FIG. 1, therein is shown a cross-sectional view of a Quad Flat Package (QFP) of a first embodiment of the present invention along line 1-1 of FIG. 2 after a stage of singulation.

A QFP 100 is shown. The QFP 100 has a die pad 102 and a transposer 104. A die 106 is attached to the die pad 102 through a die adhesive 108. The die pad 102 is attached to the transposer 104 through an interposer adhesive 110. The transposer 104 could be a printed circuit board.

The die 106 has a die bonding pad 112. The transposer 104 has an interposer bonding pad 114. The QFP 100 also has a lead 116. The lead 116 has an inner end 115 and an outer end 113. A first bonding wire 117 connects the lead 116 to the interposer bonding pad 114. A second bonding wire 118 connects the lead 116 to the die bonding pad 112. A third bonding wire 119 connects the die bonding pad 112 to the interposer bonding pad 114.

The die pad 102, the transposer 104, the die 106, the die adhesive 108, the interposer adhesive 110, the die bonding pad 112, the interposer bonding pad 114, the inner end 115, the first bonding wire 117, the second bonding wire 118, and the third bonding wire 119 are encapsulated in a mold compound 120. The transposer 104 has a terminal pad 122 on the bottom surface. The terminal pad 122 is exposed and not encapsulated.

The mold compound 120 has a bottom mold surface 121. The bottom mold surface 121 is exposed. The bottom mold surface 121 is coplanar with the outer end 113 of the lead 116. The mold compound 120 also has a top mold surface 123.

Outside signals are communicated to the QFP 100 through the lead 116 and the terminal pad 122 of the transposer 104. The transposer 104 could be a laminated interposer. A laminated interposer is a substrate that has multiple layers and has interconnect traces in them. It has been discovered that such a configuration provides advantage in signal routing and in maximizing input/output pin count.

Referring now to FIG. 2, therein is shown a bottom view of the Quad Flat Package of the first embodiment of the present invention after a stage of singulation.

The transposer 104 having the terminal pad 122 is shown. The unencapsulated portion of the lead 116 is shown to extend from the mold compound 120.

The terminal pad 122 in such a configuration can take different types of sizes and shapes. It has been discovered that such a configuration provides large flexibility in pad size and shape and it can facilitate many variations of the QFP, leading to improved device electrical performance.

Figure 3:
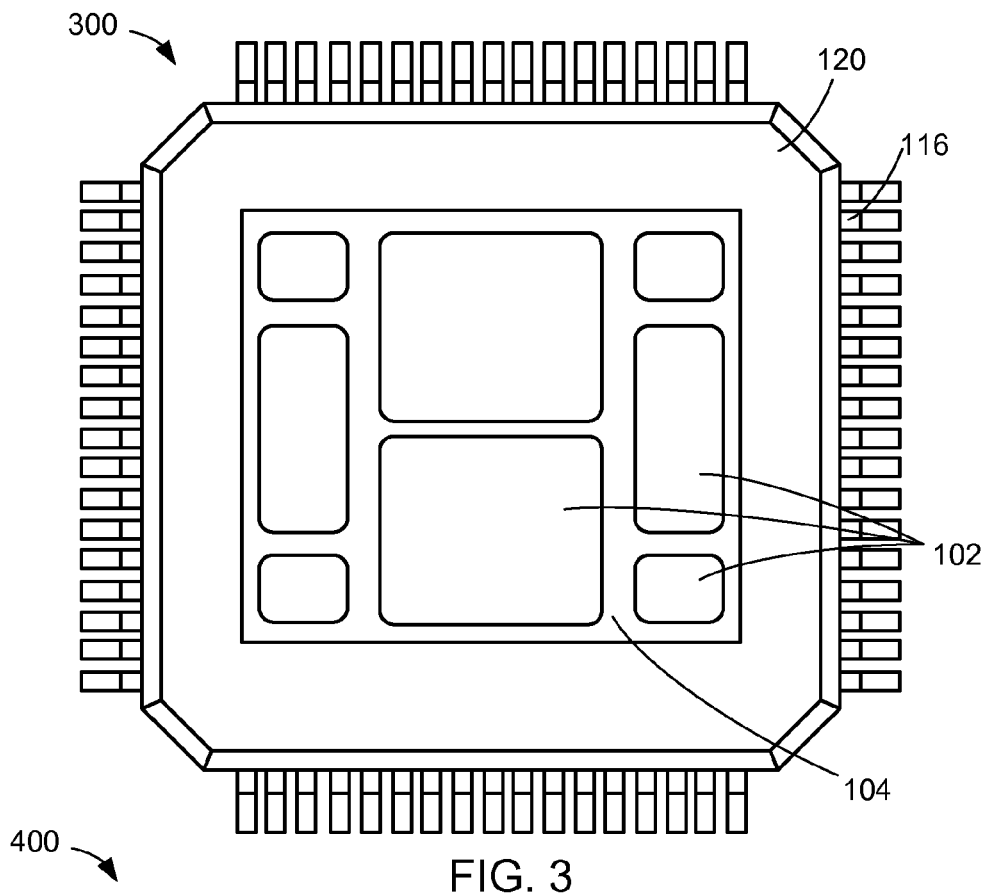
FIG. 3 is a top view of a Quad Flat Package of a second embodiment of the present invention after a stage of singulation.

Referring now to FIG. 3, therein is shown a top view of a Quad Flat Package of a second embodiment of the present invention after a stage of singulation.

A QFP 300 is shown. The QFP 300 also has the transposer 104, the lead 116, and the mold compound 120. The QFP 300 has more than one die pad 102.

In the current embodiment of the present invention, the more than one die pad 102 can accommodate more than one die 106 for the QFP 300. Such a configuration is often called an M-pad configuration. It has been discovered that the M-pad configuration enable multi-chip integration in a single QFP thus greatly enhance the functionality of the QFP.

Figure 4:
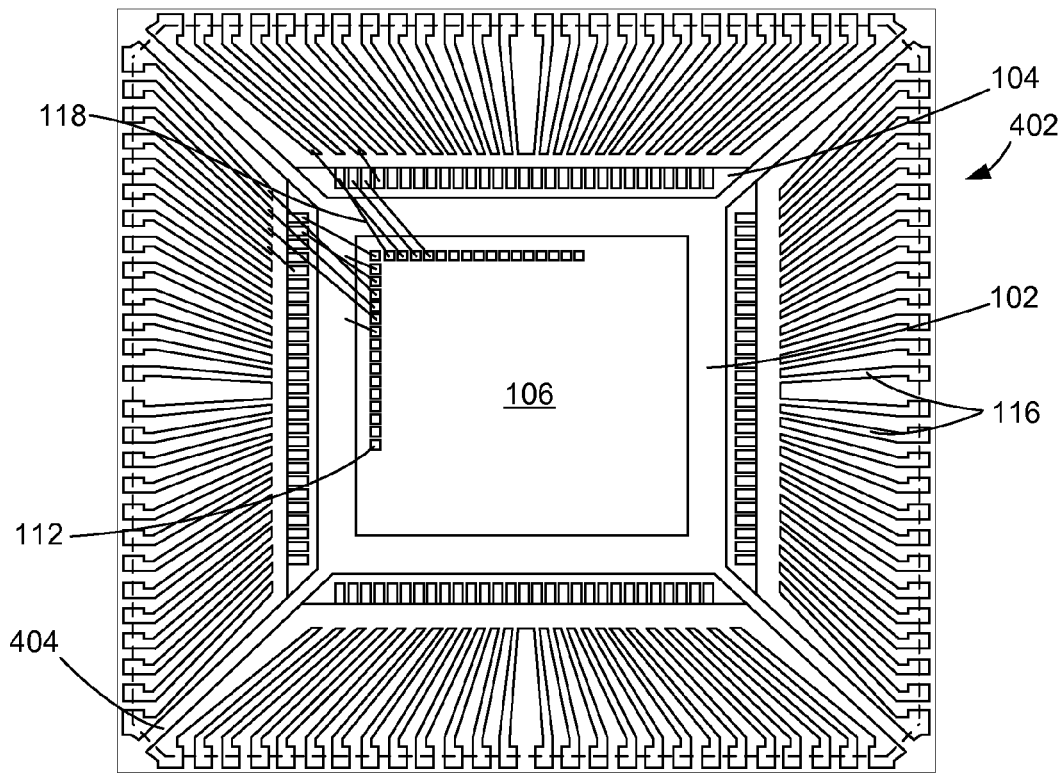
FIG. 4 is a top view of an unfinished Quad Flat Package of the first or the second embodiment of the present invention after an intermediate stage of the process.

Referring now to FIG. 4, therein is shown a top view of an unfinished Quad Flat Package of the first or the second embodiment of the present invention after an intermediate stage of the process.

An unfinished QFP 400 is shown. The unfinished QFP has a leadframe 402 having the lead 116 and a tiebar 404. The leadframe 402 also has the die pad 102 connected to the tiebar 404. The transposer 104 is attached to the bottom of the die pad 102. The die 106 is attached to the top of the die pad 102. The die bonding pad 112 is on the die 106. The bonding wire 118 is also shown.

After this intermediate stage of the process, the encapsulation process ensues and the leadframe 402 will be singulated.

Figure 5:
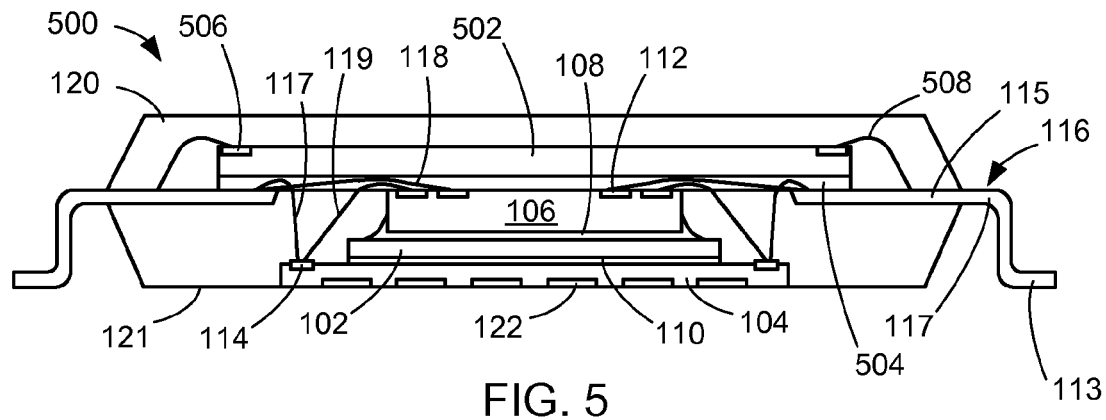
FIG. 5 is a cross-sectional view of a Quad Flat Package of a third embodiment of the present invention after a stage of singulation.

Referring now to FIG. 5, therein is shown a cross-sectional view of a Quad Flat Package of a third embodiment of the present invention after a stage of singulation.

A QFP 500 is shown. The QFP 500 has the die pad 102 and the transposer 104. The die 106 is attached to the die pad 102 through the die adhesive 108. The die pad 102 is attached to the transposer 104 through the interposer adhesive 110. The transposer 104 could be a printed circuit board.

The die 106 has the die bonding pad 112. The transposer 104 has the interposer bonding pad 114. The QFP 500 also has the lead 116. The lead 116 has the inner end 115 and the outer end 113. The first bonding wire 117 connects the lead 116 to the interposer bonding pad 114. The second bonding wire 118 connects the lead 116 to the die bonding pad 112. The third bonding wire 119 connects the die bonding pad 112 to the interposer bonding pad 114.

The QFP 500 also has stacking die 502. The stacking die 502 is attached to the die 106 and the lead contact portion 115 through a wire-in-film layer 504. The stacking die 502 has a stacking die bonding pad 506. A stacking die bonding wire 508 connects the stacking die bonding pad 506 to the lead contact portion 115. The inclusion of the stacking die 502 in the QFP 500 enhances the level of integration of the QFP 500 and leads to improved functionalities.

The die pad 102, the transposer 104, the die 106, the die adhesive 108, the interposer adhesive 110, the die bonding pad 112, the interposer bonding pad 114, the inner end 115, the first bonding wire 117, the second bonding wire 118, the third bonding wire 119, the stacking die 502, the wire-in-film layer 504, the stacking die bonding pad 506, and the stacking die bonding wire 508 are encapsulated in the mold compound 120. The transposer 104 has the terminal pad 122 on the bottom surface. The terminal pad 122 is exposed and not encapsulated.

The mold compound 120 has the bottom mold surface 121. The bottom mold surface 121 is exposed. The bottom mold surface 121 is coplanar with the outer end 113 of the lead 116.

Outside signals are communicated to the QFP 500 through the lead 116 and the terminal pad 122 of the transposer 104. The transposer 104 could be a laminated interposer. It has been discovered that such a configuration provides advantage in signal routing and in maximizing input/output pin count.

Figure 6:
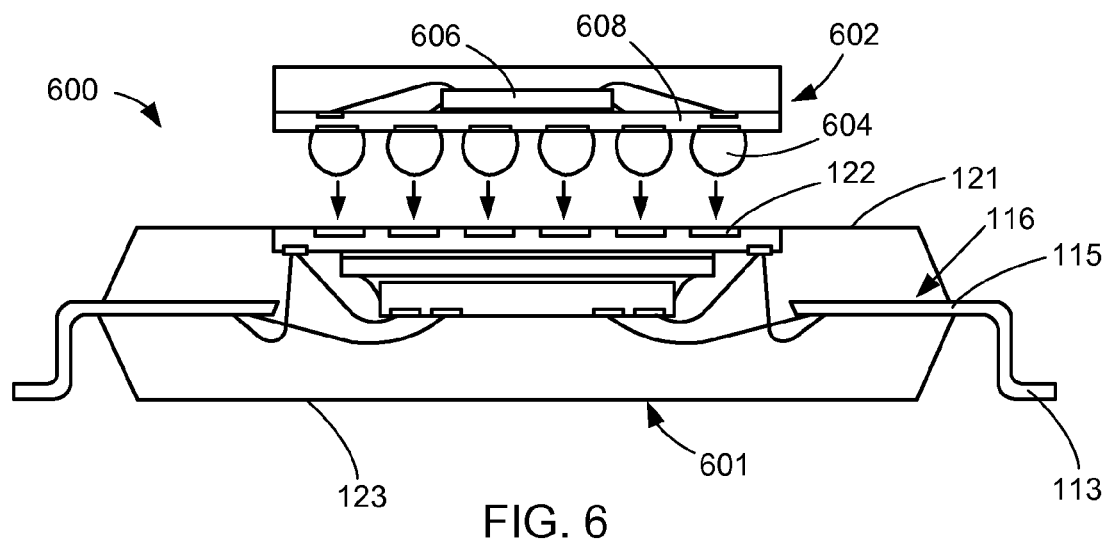
FIG. 6 is a cross-sectional view of a Quad Flat Package of a fourth embodiment of the present invention after a stage of singulation.

Referring now to FIG. 6, therein is shown a cross-sectional view of a Quad Flat Package of a fourth embodiment of the present invention after a stage of singulation.

A QFP 600 is shown. The QFP 600 has a modified QFP 601 as a component. The modified QFP 601 is based on the QFP 100 of FIG. 1. Note that the QFP 100 is illustrated in an inverted direction compared to FIG. 1.

The modified QFP 601 has the lead 116 in an inverted in direction, compared to FIG. 1. Consequently, the outer end 113 is now coplanar with the top mold surface 123, instead of the bottom mold surface 121.

The modified QFP 601 has the terminal pad 122 which is exposed at the bottom of the modified QFP 601. A top chip 602 is attached to the modified QFP 100 by attaching a top chip solder ball 604 of the top chip 602 to the terminal pad 122. The top chip 602 is an independent integrated circuit package having a top die 606 attached to a top interposer 608. The top interposer 608 could also be a printed circuit board.

The inclusion of the top chip 602 in the QFP 600 enhances the level of integration of the QFP 600 and leads to improved functionalities.

Referring now to FIG. 7, therein is shown a top view of a Quad Flat Package of a fifth embodiment of the present invention after a stage of singulation.

A QFP 700 is shown. The transposer 104, the die 106, the tiebar 404, and the lead 116 are shown. The die 106 is shown to be attached on the transposer 104. A power ring 702 is shown to be on top of the transposer 104 too. A power ring is a circular metal piece that could serve as the contact ring for the power supply for an integrated circuit package.

The transposer 104 is riveted to the tiebar 404 by a rivet 704 at the four corners of the transposer 104.

In this figure, the mold compound 120 as shown in FIG. 2 is not shown for the purpose of a clearer illustration.

Referring now to FIG. 8, therein is shown a cross-sectional view of the Quad Flat Package 700 of the fifth embodiment of the present invention along line 8-8 of FIG. 7 after a stage of singulation.

The QFP 700 is shown. The QFP 700 has the transposer 104. The die 106 is attached to the transposer 104 through the die adhesive 108. The transposer 104 could be a printed circuit board.

The die 106 has the die bonding pad 112. The transposer 104 has the interposer bonding pad 114. The QFP 700 also has the lead 116. The lead 116 has the inner end 115 and the outer end 113. The first bonding wire 117 connects the lead 116 to the interposer bonding pad 114. The second bonding wire 118 connects the lead 116 to the die bonding pad 112. The third bonding wire 119 connects the die bonding pad 112 to the interposer bonding pad 114.

The QFP 700 also has the tiebar 404. The tiebar 404 has a tiebar contact pad 405 and a tiebar bend 407. The transposer 104 is connected to the tie bar 404 with the rivet 704.

The transposer 104, the die 106, the die adhesive 108, the die bonding pad 112, the interposer bonding pad 114, the inner end 115, the first bonding wire 117, the second bonding wire 118, the third bonding wire 119, the tiebar contact pad 405, the tiebar bend 407, and the rivet 704 are encapsulated in the mold compound 120. The transposer 104 has the terminal pad 122 on the bottom surface. The terminal pad 122 is exposed and not encapsulated.

The mold compound 120 has the bottom mold surface 121. The bottom mold surface 121 is exposed. The bottom mold surface 121 is coplanar with the outer end 113 of the lead 116.

Outside signals are communicated to the QFP 700 through the lead 116 and the terminal pad 122 of the transposer 104. The transposer 104 could be a laminated interposer. It has been discovered that such a configuration provides advantage in signal routing and in maximizing input/output pin count.

The function of the rivet 704 is to pin the transposer 104 firmly to the QFP 700 and to increase the mechanical stability of the transposer 104. It has been discovered that such a configuration decreases the failure rate of the QFP 700 and thus increases the reliability of the QFP 700 and reduces the manufacturing cost.

Referring now to FIG. 9, therein is shown a cross-sectional view of a Quad Flat Package of a sixth embodiment of the present invention after a stage of singulation.

A QFP 900 is shown. The QFP 900 has the transposer 104. The die 106 is attached to the transposer 104 through the die adhesive 108. The transposer 104 could be a printed circuit board.

The die 106 has the die bonding pad 112. The transposer 104 has the interposer bonding pad 114. The QFP 900 also has the lead 116. The lead 116 has the inner end 115 and the outer end 113. The first bonding wire 117 connects the lead 116 to the interposer bonding pad 114. The second bonding wire 118 connects the lead 116 to the die bonding pad 112. The third bonding wire 119 connects the die bonding pad 112 to the interposer bonding pad 114.

The QFP 900 also has the tiebar 404. The tiebar 404 has the tiebar contact pad 405 and the tiebar bend 407. The transposer 104 has a transposer slot 902 at the side surface of the transposer 104. A portion of the tiebar contact pad 405 is inserted into the transposer slot 902 so that the transposer 104 is connected to the tie bar 404 through the transposer slot 902.

The transposer 104, the die 106, the die adhesive 108, the die bonding pad 112, the interposer bonding pad 114, the first bonding wire 117, the second bonding wire 118, the third bonding wire 119, the tiebar contact pad 405, and the tiebar bend 407 are encapsulated in the mold compound 120. The transposer 104 has the terminal pad 122 on the bottom surface. The terminal pad 122 is exposed and not encapsulated.

The mold compound 120 has the bottom mold surface 121. The bottom mold surface 121 is exposed. The bottom mold surface 121 is coplanar with the outer end 113 of the lead 116.

Outside signals are communicated to the QFP 900 through the lead 116 and the terminal pad 122 of the transposer 104. The transposer 104 could be a laminated interposer. It has been discovered that such a configuration provides advantage in signal routing and in maximizing input/output pin count.

The function of the bottom transposer slot 902 is to fasten the transposer 104 firmly to the QFP 900 and to increase the mechanical stability of the transposer 104. It has been discovered that such a configuration decreases the failure rate of the QFP 900 and thus increases the reliability of the QFP 900 and reduces the manufacturing cost.

Figure 10:
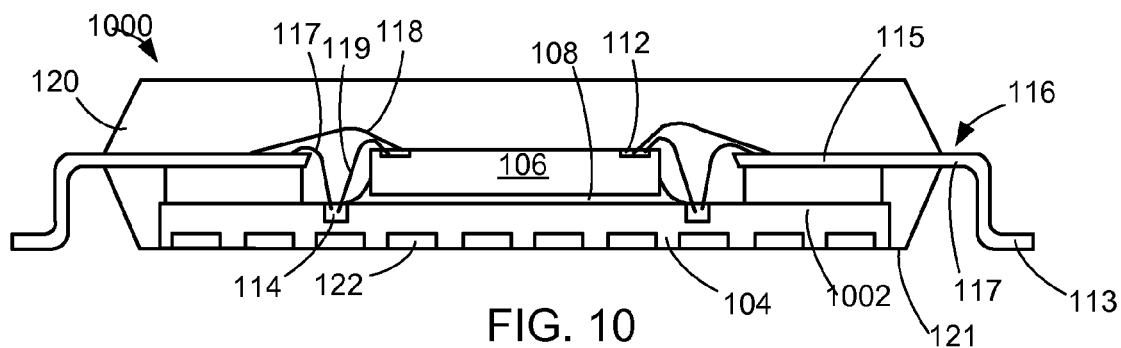
FIG. 10 is a cross-sectional view of a Quad Flat Package of a seventh embodiment of the present invention along line 10-10 of FIG. 11 after a stage of singulation.
Figure 11:
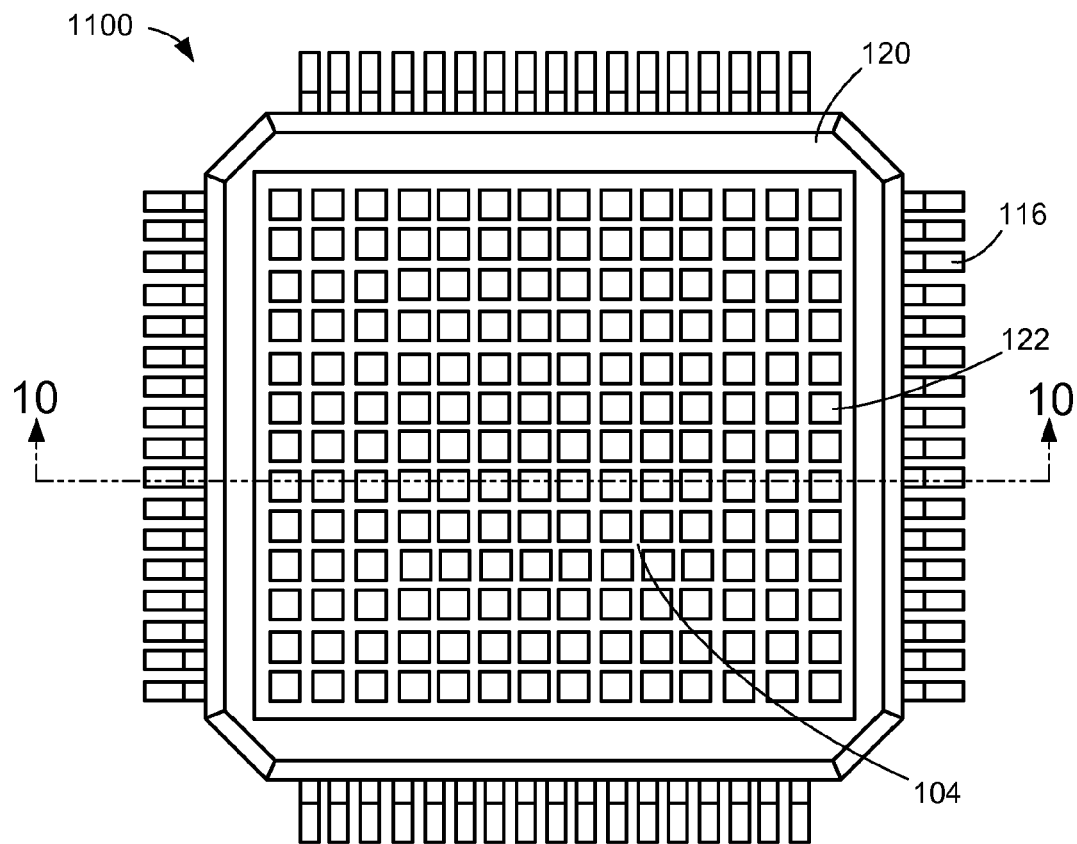
FIG. 11 is a bottom view of the Quad Flat Package of the seventh embodiment of the present invention after a stage of singulation.

Referring now to FIG. 10, therein is shown a cross-sectional view of a Quad Flat Package of a seventh embodiment of the present invention along line 10-10 of FIG. 11 after a stage of singulation.

A QFP 1000 is shown. The QFP 1000 has the transposer 104. The die 106 is attached to a top surface of the transposer 104 through the die adhesive 108. The transposer 104 could be a printed circuit board.

The die 106 has the die bonding pad 112. The transposer 104 has the interposer bonding pad 114. The QFP 1000 also has the lead 116. The lead 116 has the inner end 115 and the outer end 113. Compared to FIGS. 1, 5, 6, 8, and 9, in the current embodiment of the present invention, the inner end 115 overhangs the transposer 104 and is attached to the top surface of the transposer 104 through an adhesive pad 1002. This overhang configuration enables a larger transposer 104 to be integrated in the QFP 1000 and leads to a larger number of the terminal pad 122. It has been discovered that such a configuration enhances the pin count of the QFP 1000.

The function of the adhesive pad 1002 is to support the leadframe 402 during the wire bonding process. The adhesive pad 1002 could be pre-printed on either the leadframe 402 or the transposer 104. The adhesive pad 1002 could also be pre-taped on either the leadframe 402 or the transposer 104. The adhesive pad 1002 could be in the form of one piece of continuous ring of adhesive material and could also be in the form of separate patches of adhesive material attached to each individual inner end 115 of each lead 116 of the leadframe 402.

The first bonding wire 117 connects the lead 116 to the interposer bonding pad 114. The second bonding wire 118 connects the lead 116 to the die bonding pad 112. The third bonding wire 119 connects the die bonding pad 112 to the interposer bonding pad 114.

The transposer 104, the die 106, the die adhesive 108, the die bonding pad 112, the interposer bonding pad 114, the inner end 115, the first bonding wire 117, the second bonding wire 118, the third bonding wire 119, and the adhesive pad 1002 are encapsulated in the mold compound 120. The transposer 104 has the terminal pad 122 on the bottom surface. The terminal pad 122 is exposed and not encapsulated.

The mold compound 120 has the bottom mold surface 121. The bottom mold surface 121 is exposed. The bottom mold surface 121 is coplanar with the outer end 113 of the lead 116.

Outside signals are communicated to the QFP 1000 through the lead 116 and the terminal pad 122 of the transposer 104. The transposer 104 could be a laminated interposer. It has been discovered that such a configuration provides advantage in signal routing and in maximizing input/output pin count.

Referring now to FIG. 11, therein is shown a bottom view of the Quad Flat Package of the seventh embodiment of the present invention after a stage of singulation.

The transposer 104 having the terminal pad 122 is shown. The unencapsulated portion of the lead 116 is shown to extend from the mold compound 120.

Compared to FIG. 2, in the current embodiment of the present invention, the number of the terminal pad 122 is significantly increased. It has been discovered that such a configuration facilities maximizing the signal input/output pin count.

Figure 12:
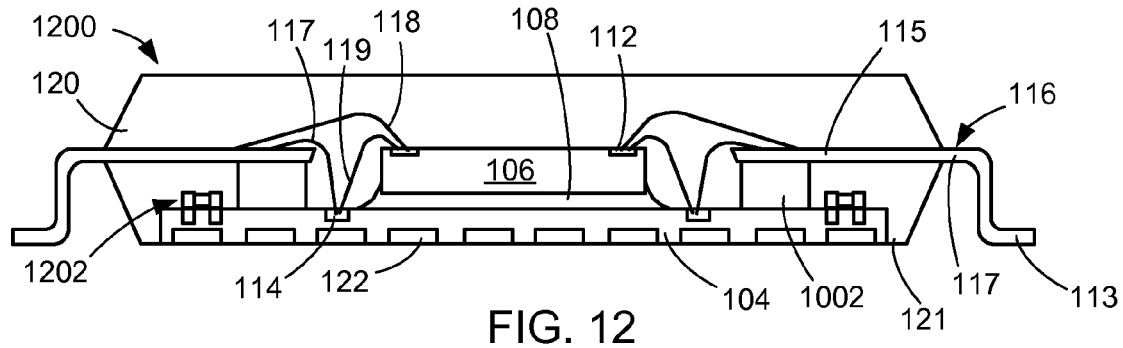
FIG. 12 is a cross-sectional view of a Quad Flat Package of an eighth embodiment of the present invention after a stage of singulation.

Referring now to FIG. 12, therein is shown a cross-sectional view of a Quad Flat Package of an eighth embodiment of the present invention after a stage of singulation.

A QFP 1200 is shown. The QFP 1200 has the transposer 104. The die 106 is attached to the transposer 104 through the die adhesive 108. The transposer 104 could be a printed circuit board.

The die 106 has the die bonding pad 112. The transposer 104 has the interposer bonding pad 114. The QFP 1200 also has the lead 116. The lead 116 has the inner end 115 and the outer end 113. Compared to FIGS. 1, 5, 6, 8, and 9, in the current embodiment of the present invention, the inner end 115 overhangs the transposer 104 and is attached to the transposer 104 through the adhesive pad 1002. This overhang configuration enables the larger transposer 104 to be integrated in the QFP 1200 and leads to a larger number of the terminal pad 122. It has been discovered that such a configuration enhances the pin count of the QFP 1200.

The function of the adhesive pad 1002 is to support the leadframe 402 during the wire bonding process. The adhesive pad 1002 could be pre-printed on either the leadframe 402 or the transposer 104. The adhesive pad 1002 could also be pre-taped on either the leadframe 402 or the transposer 104.

A passive device 1202 is attached to the transposer 104. The passive device 1202 could be pre-attached to the transposer 104.

The first bonding wire 117 connects the lead 116 to the interposer bonding pad 114. The second bonding wire 118 connects the lead 116 to the die bonding pad 112. The third bonding wire 119 connects the die bonding pad 112 to the interposer bonding pad 114.

The transposer 104, the die 106, the die adhesive 108, the die bonding pad 112, the interposer bonding pad 114, the inner end 115, the first bonding wire 117, the second bonding wire 118, the third bonding wire 119, the adhesive pad 1002, and the passive device 1202 are encapsulated in the mold compound 120. The transposer 104 has the terminal pad 122 on the bottom surface. The terminal pad 122 is exposed and not encapsulated.

The mold compound 120 has the bottom mold surface 121. The bottom mold surface 121 is exposed. The bottom mold surface 121 is coplanar with the outer end 113 of the lead 116.

Outside signals are communicated to the QFP 1200 through the lead 116 and the terminal pad 122 of the transposer 104. The transposer 104 could be a laminated interposer. It has been discovered that such a configuration provides advantage in signal routing and in maximizing input/output pin count.

The inclusion of the passive device 1202 increases the level of integration of the QFP 1200 and leads to more functionality to be included in a single integrated circuit package.

Figure 13:
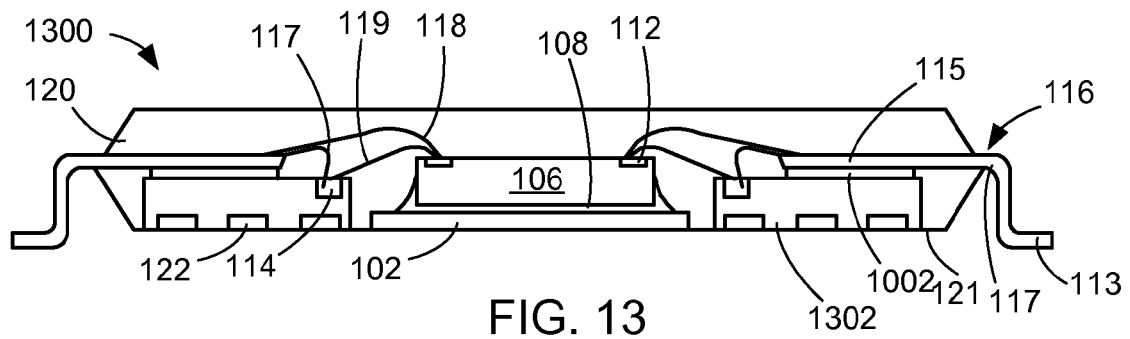
FIG. 13 is a cross-sectional view of a Quad Flat Package of a ninth embodiment of the present invention after a stage of singulation.

Referring now to FIG. 13, therein is shown a cross-sectional view of a Quad Flat Package of a ninth embodiment of the present invention after a stage of singulation.

A QFP 1300 is shown. The QFP 1300 has the die pad 102 and a substrate transposer 1302. The die 106 is attached to the die pad 102 through the die adhesive 108. The substrate transposer 1302 is of ring shaped and surrounds the die pad 102 and the die 106. The substrate transposer 1302 could be riveted to the tiebar 404 of the leadframe 402 at the four corners of the substrate transposer 1302, as illustrated in FIG. 7.

A transposer is a substrate used to route signals from the vertical axis interconnects. Transposers provide for significant rerouting of signals, allowing advanced configurations to be constructed, including wide date buses, monolithic emulations, optimized interfaces, and heterogeneous stacks. The substrate transposer 1302 could be a printed circuit board.

The die 106 has the die bonding pad 112. The substrate transposer 1302 has the interposer bonding pad 114. The QFP 1300 also has the lead 116. The lead 116 has the inner end 115 and the outer end 113. Compared to FIGS. 1, 5, 6, 8, and 9, in the current embodiment of the present invention, the inner end 115 overhangs the substrate transposer 1302 and is attached to the substrate transposer 1302 through the adhesive pad 1002. This overhang configuration enables a larger substrate transposer 1302 to be integrated in the QFP 1300 and leads to a larger number of the terminal pad 122. It has been discovered that such a configuration enhances the pin count of the QFP 1300.

The function of the adhesive pad 1002 is to support the leadframe 402 during the wire bonding process. The adhesive pad 1002 could be pre-printed on either the leadframe 402 or the substrate transposer 1302. The adhesive pad 1002 could also be pre-taped on either the leadframe 402 or the substrate transposer 1302.

The first bonding wire 117 connects the lead 116 to the interposer bonding pad 114. The second bonding wire 118 connects the lead 116 to the die bonding pad 112. The third bonding wire 119 connects the die bonding pad 112 to the interposer bonding pad 114.

The die pad 102, the substrate transposer 1302, the die 106, the die adhesive 108, the die bonding pad 112, the interposer bonding pad 114, the inner end 115, the adhesive pad 1002, the first bonding wire 117, the second bonding wire 118, and the third bonding wire 119 are encapsulated in the mold compound 120. The substrate transposer 1302 has the terminal pad 122 on the bottom surface. The terminal pad 122 is exposed and not encapsulated.

The mold compound 120 has the bottom mold surface 121. The bottom mold surface 121 is exposed. The bottom mold surface 121 is coplanar with the outer end 113 of the lead 116.

Outside signals are communicated to the QFP 1300 through the lead 116 and the terminal pad 122 of the substrate transposer 1302. The substrate transposer 1302 could be a laminated interposer. It has been discovered that such a configuration provides advantage in signal routing and in maximizing input/output pin count.

Figure 14:
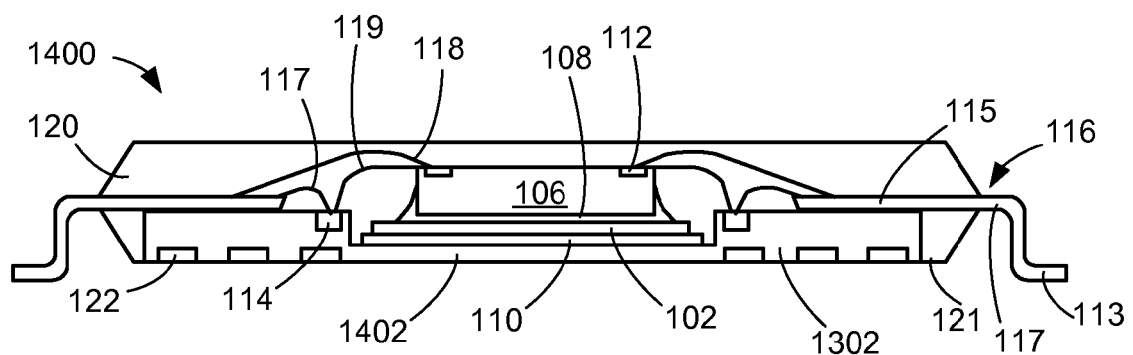
FIG. 14 is a cross-sectional view of a Quad Flat Package of a tenth embodiment of the present invention after a stage of singulation.

Referring now to FIG. 14, therein is shown a cross-sectional view of a Quad Flat Package of a tenth embodiment of the present invention after a stage of singulation.

A QFP 1400 is shown. The QFP 1400 has the die pad 102 and a substrate transposer 1302. The die 106 is attached to the die pad 102 through the die adhesive 108. The substrate transposer 1302 has a recessed center portion 1402. The die pad 102 attached with the die 106 is attached to the recessed center portion 1402 of the substrate transposer 1302 through the interposer adhesive 110. The substrate transposer 1302 could be riveted to the tiebar 404 of the leadframe 402 at the four corners of the substrate transposer 1302, as illustrated in FIG. 7. The substrate transposer 1302 could be a printed circuit board.

The die 106 has the die bonding pad 112. The substrate transposer 1302 has the interposer bonding pad 114. The QFP 1400 also has the lead 116. The lead 116 has the inner end 115 and the outer end 113. Compared to FIGS. 1, 5, 6, 8, and 9, in the current embodiment of the present invention, the inner end 115 overhangs the substrate transposer 1302. Compared to FIGS. 10, 12, and 13, in the current embodiment of the present invention, the lead 116 is not attached to the substrate transposer 1302 through the adhesive pad 1002 of FIG. 10. There is just enough clearance between the lead 116 and the substrate transposer 1302 to enable the mold compound 120 to flow freely during the encapsulation process. The clearance is not too wide so that wire bonding can be made stably by temporarily claiming down the inner end 115 onto the substrate transposer 1302 without deforming either the inner end 115 or the substrate transposer 1302.

This overhang configuration enables a larger substrate transposer 1302 to be integrated in the QFP 1400 and leads to a larger number of the terminal pad 122. It has been discovered that such a configuration enhances the pin count of the QFP 1400.

The first bonding wire 117 connects the lead 116 to the interposer bonding pad 114. The second bonding wire 118 connects the lead 116 to the die bonding pad 112. The third bonding wire 119 connects the die bonding pad 112 to the interposer bonding pad 114.

The die pad 102, the substrate transposer 1302, the die 106, the die adhesive 108, interposer adhesive 110, the die bonding pad 112, the interposer bonding pad 114, the inner end 115, the first bonding wire 117, the second bonding wire 118, and the third bonding wire 119 are encapsulated in the mold compound 120. The substrate transposer 1302 has the terminal pad 122 on the bottom surface. The terminal pad 122 is exposed and not encapsulated.

The mold compound 120 has the bottom mold surface 121. The bottom mold surface 121 is exposed. The bottom mold surface 121 is coplanar with the outer end 113 of the lead 116.

Outside signals are communicated to the QFP 1400 through the lead 116 and the terminal pad 122 of the substrate transposer 1302. The substrate transposer 1302 could be a laminated interposer. It has been discovered that such a configuration provides advantage in signal routing and in maximizing input/output pin count.

Figure 15:
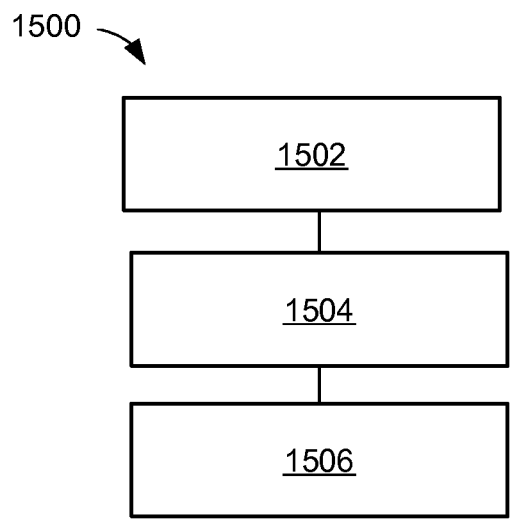
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes: conductively bonding a first surface of a transposer to an inner end of a lead separate from the transposer in a block 1502; conductively bonding a die to the first surface of the transposer in a block 1504; and encapsulating the inner end with a mold compound having a bottom mold surface that is exposed and is coplanar with a surface of the transposer opposite the first surface in a block 1506.

It is discovered that the present invention increases the lead or pin count and improves signal board routing and thus enhances the packaging density of the QFP system. The present invention thus facilitates and accommodates the modern trend of semiconductor packaging of integrating more and more device functionality in an ever-shrinking footprint.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a transposer;
   an adhesive pad attached to the transposer, the adhesive pad in a form of a continuous ring;
   a lead having an inner end wire bonded to a first surface of the transposer, the inner end attached to the adhesive pad;
   a die conductively bonded to the first surface of the transposer, the die and the adhesive pad attached to the first surface; and
   a mold compound encapsulating the inner end, the mold compound having a bottom mold surface exposed and coplanar with a surface of the transposer opposite the first surface.

2. The system as claimed in claim 1 wherein the mold compound has the bottom mold surface coplanar with an outer end of the lead.

3. The system as claimed in claim 1 wherein the transposer has a terminal pad on the surface opposite the first surface.

4. The system as claimed in claim 1 further comprising:
   a die pad attached to the die and also attached to the first surface of the transposer.

5. The system as claimed in claim 1 further comprising:
   a multiplicity of die pads attached to the first surface of the transposer.

6. The system as claimed in claim 1 further comprising:
   a tiebar connected to the transposer.

7. The system as claimed in claim 6 further comprising:
   a rivet riveting a tiebar contact pad of the tiebar to the transposer.

8. The system as claimed in claim 6 further comprising:
   a passive device attached to the first surface of the transposer.

9. The system as claimed in claim 6 wherein the transposer is a substrate transposer having a ring shape and surrounding the die.

10. The system as claimed in claim 6 wherein the transposer is a substrate transposer having a recessed center portion and a die pad is attached to the recessed center portion.

* * * * *